(12) United States Patent
Trivedi

(10) Patent No.: US 9,070,786 B2
(45) Date of Patent: Jun. 30, 2015

(54) METHODS FOR FORMING TRANSISTORS

(71) Applicant: Vishal P. Trivedi, Chandler, AZ (US)

(72) Inventor: Vishal P. Trivedi, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 0 days.

(21) Appl. No.: 14/505,831

(22) Filed: Oct. 3, 2014

(65) Prior Publication Data

US 2015/0056767 A1 Feb. 26, 2015

Related U.S. Application Data

(62) Division of application No. 13/560,533, filed on Jul. 27, 2012, now Pat. No. 8,912,569.

(51) Int. Cl.
   *H01L 21/8249* (2006.01)
   *H01L 27/06* (2006.01)
   *H01L 27/07* (2006.01)

(52) U.S. Cl.
   CPC ........ *H01L 21/8249* (2013.01); *H01L 27/0623* (2013.01); *H01L 27/0705* (2013.01)

(58) Field of Classification Search
   CPC ............ H01L 27/0705; H01L 27/0623; H01L 21/8249
   USPC ............ 438/235; 257/192, E27.015, E21.696
   See application file for complete search history.

(56) References Cited

U.S. PATENT DOCUMENTS

| | | | | |
|---|---|---|---|---|
| 4,639,761 A * | 1/1987 | Singer et al. | .................. | 257/336 |
| 7,638,386 B2 | 12/2009 | Kirchgessner et al. | | |
| 8,299,578 B1 * | 10/2012 | Babcock | ....................... | 257/577 |
| 2004/0119136 A1 * | 6/2004 | Cai et al. | ....................... | 257/526 |
| 2005/0090051 A1 * | 4/2005 | Yi | ................................. | 438/202 |
| 2007/0181919 A1 * | 8/2007 | Tsai et al. | ...................... | 257/288 |
| 2007/0284659 A1 * | 12/2007 | Abadeer et al. | ............... | 257/343 |
| 2010/0102386 A1 * | 4/2010 | You | ................................ | 257/336 |
| 2011/0156096 A1 * | 6/2011 | Udrea et al. | ................... | 257/141 |
| 2012/0094457 A1 * | 4/2012 | Gabrys | .......................... | 438/286 |

* cited by examiner

*Primary Examiner* — William F Kraig
*Assistant Examiner* — Pavel Ivanov
(74) *Attorney, Agent, or Firm* — Ingrassia Fisher & Lorenz, P.C.

(57) ABSTRACT

A hybrid transistor is produced to have a substrate with a first (e.g., P type) well region and a second (e.g., N type) well region with an NP or PN junction therebetween. A MOS portion of the hybrid transistor has an (e.g., N type) source region in the first well region and a gate conductor overlying and insulated from the well regions. A drain or anode (D/A) portion in the second well region collects current from the source region, and includes a bipolar transistor having an (e.g., N+) emitter region, a (e.g., P type) base region and a (e.g., N type) collector region laterally separated from the junction. Different LDMOS-like or IGBT-like properties are obtained depending on whether the current is extracted from the hybrid transistor via the bipolar transistor base or emitter or both. The bipolar transistor is desirably a vertical heterojunction transistor.

20 Claims, 6 Drawing Sheets

METHODS FOR FORMING TRANSISTORS

CROSS-REFERENCE TO RELATED APPLICATION

This application is a divisional of co-pending U.S. application Ser. No. 13/560,533, filed Jul. 27, 2012.

FIELD OF THE INVENTION

The present invention generally relates to semiconductor devices and circuits and methods for fabricating semiconductor devices and circuits, and more particularly relates to semiconductor devices and circuits embodying a series coupled combination of insulated gate (IG) field effect transistor (FET) and bipolar transistor (BT) devices.

BACKGROUND OF THE INVENTION

Insulated gate field effect transistors (IGFETs) are much used in modern electronics as individual devices and as part of various integrated circuits (ICs). Metal-oxide-semiconductor (MOS) devices are a well known form of IGFETs and are commonly referred to by the abbreviation MOSFET. The abbreviations MOS and MOSFET and the terms for which they stand are commonly used in the art to refer to IGFETs irrespective of whether the conductive gate of such devices is metallic or of some other conductor, and irrespective of whether the gate insulator is of oxide or some other dielectric. Unless specifically noted otherwise, this broader interpretation of the abbreviations MOS, MOSFET and the terms for which they stand is intended herein, that is, any conductive material and not just metallic elements may be used for the gate conductor and any dielectric material and not just oxides may be used for the gate insulator.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
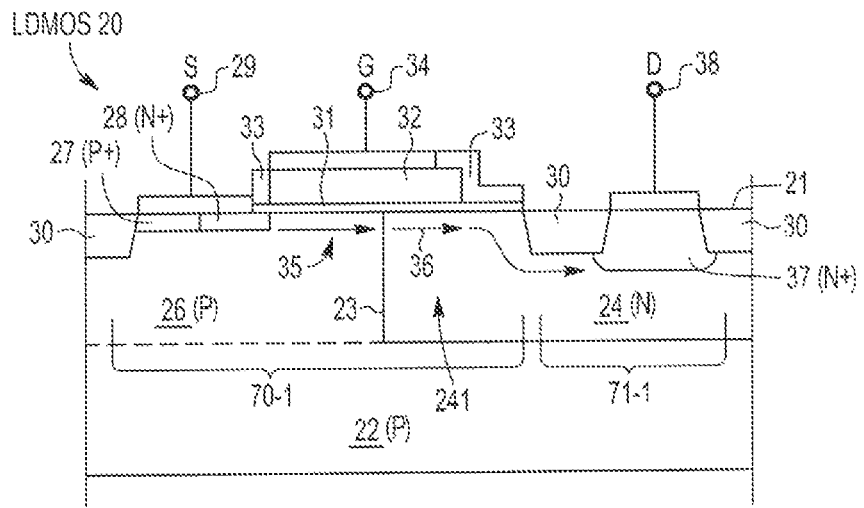
FIG. 1 shows a simplified cross-sectional view of a laterally-diffused-metal-oxide-semiconductor (LDMOS) device according to the prior art.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments of the invention described herein are, for example, capable of operation or arrangement in sequences other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" and the abbreviation "SC" are intended to include any semiconductor whether single crystal, poly-crystalline or amorphous and to include type IV semiconductors, non-type IV semiconductors, compound semiconductors as well as organic and inorganic semiconductors. Further, the terms "substrate", "semiconductor substrate" and "SC substrate" are intended to include single crystal structures, polycrystalline structures, amorphous structures, thin film structures, layered structures as for example and not intended to be limiting, semiconductor-on-insulator (SOI) structures, insulator on semiconductor (IOS) structures and combinations thereof For convenience of explanation and not intended to be limiting, semiconductor devices and methods of fabrication are described herein for silicon semiconductors, but persons of skill in the art will understand that other semiconductor materials may also be used. Additionally, various device types and/or doped SC regions may be identified as being of N type or P type, but this is merely for convenience of description and not intended to be limiting, and such identification may be replaced by the more general description of being of a "first conductivity type" or a "second, opposite conductivity type" where the first type may be either N or P type and the second type is then either P or N type.

Various embodiments of the invention will be illustrated for N-channel MOSFETs and NPN bipolar transistors or elements thereof, but, again, this is merely for convenience of description and is not intended to be limiting. Persons of skill in the art will understand that P-channel MOSFETs and related bipolar devices or regions and other semiconductor devices and circuits embodying either or both N and P or P and N combinations may be provided by appropriate interchange of conductivity types in the various regions. For convenience of description, the convention is adopted in the various drawings of identifying the exemplary (e.g., N-channel) configuration by placing the corresponding conductivity type in parentheses following the associated reference number. For example, in FIGS. 1-11, body or well region contacts 27, 47 are identified as 27(P+), 47(P+), source regions 28, 48 are identified as 28(N+), 48(N+), well regions 24, 44; 26, 46 are identified as 24(N), 44(N); 26(P), 46(P), etc., to illustrate the exemplary conductivity types for an N-channel embodiment. It will be understood that this is by way of example and not limitation.

Various modifications have been made to conventional MOSFETs or IGFETs to improve their various properties, e.g., breakdown voltage, gain, leakage current, etc. Nevertheless, there is an ongoing need for further improvements and flexibility. This is especially true when the MOSFET and/or IGFET is being combined with other device types such as bipolar regions or transistors as part of an integrated circuit (IC) and/or being fabricated using a common manufacturing process. The various embodiments of the invention illustrated herein provide devices of improved and flexible properties.

FIG. 1 shows a simplified cross-sectional view of laterally-diffused-metal-oxide-semiconductor (LDMOS) device 20 according to the prior art. LDMOS device 20 comprises semiconductor (SC) substrate 22 (e.g., P type) extending to upper surface 21. Substrate 22 includes (e.g., N type) well region 24 and (e.g., P type) well region 26 separated by NP junction 23, both generally extending to upper surface 21. Located within well regions 24, 26 are shallow trench isolation (STI) regions 30 also extending to surface 21, but they may be omitted in other embodiments. Located within well region 26 are (e.g., P+) well contact region 27 and (e.g., N+) source region 28, extending to surface 21. Located within well region 24 is (e.g., N+) drain region 37 extending to surface 21. Located over surface 21 at least between source region 28 and NP junction 23 is (e.g., oxide) gate dielectric 31. Overlying gate dielectric 31 is (e.g., doped poly) gate conductor 32. Gate dielectric 31 and gate conductor 32 may extend partly over (e.g., drift space) portion 241 of well region 24. Gate conductor 32 has lateral dielectric regions 33 on the left and right edges thereof, to minimize gate-source and gate-drain leakage or capacitance. Source (and well region) electrode 29 is electrically coupled to source region 28 (and well contact region 27). Gate electrode 34 is electrically coupled to gate conductor 32. Drain electrode 38 is electrically coupled to drain region 37.

When appropriate electrical potentials are applied to gate electrode 32 and drain electrode 38 relative to well contact region 27 and source region 28, electrically conductive channel 35 forms in well region 26, thereby allowing source-drain (S-D) current 36 to flow from source (S) region 28 through channel (CH) region 35 in well region 26, through drift space (DS) 241 in well region 24, underneath STI region 30 (if present) to (e.g., N+) drain (D) region 37. Reference number 70-1, encompassing source (S) region 28 and channel (CH) region 35, identifies the origin and primary control region of source-drain (S-D) current 36 of device 20. For convenience, this is referred to as "MOS portion" 70-1 of device 20. Source terminal 29 is coupled to source (S) region 28 and well contact region 27, and gate terminal 34 is coupled to gate (G) conductor 32, and both are associated with MOS portion 70-1. Reference number 71-1 (hereafter "drain portion" 71-1) encompassing drain (D) region 37 identifies the terminus of source-drain (S-D) current 36 of device 20. Drain (D) terminal 38 is associated with drain (D) region 37.

Figure 2:
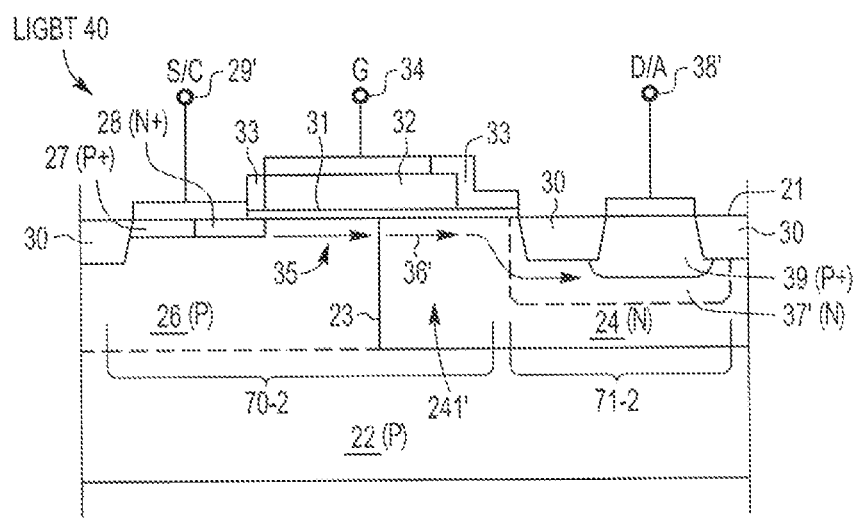
FIG. 2 shows a simplified cross-sectional view of a lateral insulated-gate-bipolar-transistor (LIGBT) semiconductor device according to the prior art.

FIG. 2 shows a simplified cross-sectional view of lateral-insulated-gate-bipolar-transistor (LIGBT) semiconductor device 40, according to the prior art. Reference number 70-2, encompassing source (S) region 28 and channel (CH) region 35, identifies the origin and primary control region of source-drain (S-D) current 36' of device 40. For convenience, this is referred to as "MOS portion" 70-2 of device 40. Source (S) or cathode (C) terminal 29 is coupled to source (S) region 28 and well contact region 27, and gate (G) terminal 34 is coupled to gate (G) conductor 32, and both are associated with MOS portion 70-2. Reference number 71-2 (hereafter "drain or anode portion" 71-2), encompassing buffer (BUF) region 37' and anode (A) region 39, identifies the terminus of source-drain current 36' of device 40. Drain (D) or anode (A) terminal 38' (collectively D/A terminal 38') is associated with buffer (BUF) region 37' and anode (A) region 39.

Many of the elements of MOS portion 70-2 of LIGBT device 40 of FIG. 2 are substantially similar in function and overall arrangement with MOS portion 70-1 of device 20 of FIG. 1, and the identification and discussion thereof in connection with FIG. 1 is incorporated herein by reference. However, drain or anode portion 71-2 of LIGBT device 40 of FIG. 2 differs significantly from drain portion 71-1 of LDMOS device 20 FIG. 1. In LDMOS device 20 of FIG. 1, S-D current 36 in drain portion 71-1 passes through (e.g., N type) drift space 241, underneath STI region 30 if present, to (e.g., N+) drain region 37. In LIGBT device 40 of FIG. 2, S-D current 36' in drain or anode portion 71-2 passes through drift space 241' analogous to drift space 241, underneath STI region 30 if present, and through (e.g., N type) buffer (BUF) region 37' to (e.g., P+) anode region 39.

The presence of (e.g., P+) anode region 39 modifies the electrical characteristics of LIGBT device 40 of FIG. 2 compared to LDMOS device 20 of FIG. 1. In particular, other things being substantially equal, the current flow in LIGBT device 40 is defined by MOS-controlled (e.g., PNP) lateral bipolar junction transistor (BJT) current, where regions 26, 27 form the emitter, regions 24 and 37' form the base, and region 39 forms the collector of the BJT and MOS-portion 70-2 forms the MOS structure. Specifically, when (e.g., positive) gate voltage higher than threshold voltage of the MOS portion is applied with respect to the source or cathode, an inversion channel is formed that connects the (e.g., N+) cathode to (e.g., N type) drift region 241'. This creates the base current of the above-mentioned BJT, which in turn results in amplified current at the drain/collector region 39

Figure 3:
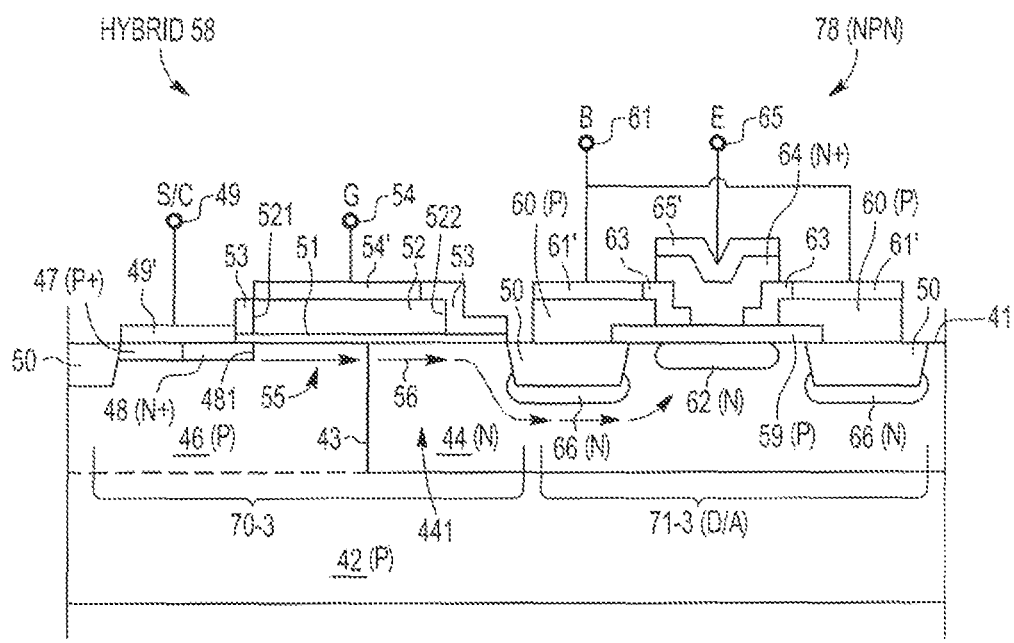
FIG. 3 shows a simplified cross-sectional view of a hybrid transistor according to an embodiment of the invention.

In some applications, it is desirable to have a device that can provide properties analogous to LDMOS device 20 of FIG. 1 or analogous to LIGBT device 40 of FIG. 2, manufactured on the same production line and with little or no modification (e.g., with only metallization or other "back-end" changes) during the manufacturing process. FIG. 3 shows a simplified cross-sectional view of hybrid transistor or semiconductor device 58 according to an embodiment of the invention, providing these and other desirable capabilities. Hybrid transistor or device 58 of FIG. 3 comprises semiconductor (SC) substrate 42 (e.g., P type) extending to upper surface 41. Substrate 42 includes (e.g., N type) well region 44 and (e.g., P type) well region 46 separated by NP junction 43, both generally extending to upper surface 41. Desirably located within well regions 44, 46 are shallow trench isolation (STI) regions 50 also extending to surface 41, but they may be omitted in other embodiments. Located within well region 46 are (e.g., P+) well contact region 47 and (e.g., N+) source region 48, extending to surface 41. Located within (e.g., N type) well region 44 is drain or anode (D/A) portion 71-3 extending to surface 41. Located over surface 41 at least between source region 48 and NP junction 43 is (e.g., oxide) gate dielectric 51. Overlying gate dielectric 51 is (e.g., doped poly) gate conductor 52. Gate dielectric 51 and gate conductor 52 may extend over (e.g., drift space) portion 441 of well region 44. Gate conductor 52 desirably but not essentially has lateral dielectric regions 53 on the left and right edges thereof, to minimize gate-source and gate-drain leakage or capacitance. Source (S) or cathode (C) electrode 49 (collectively S/C region 49) is electrically coupled by (e.g., silicide) contact 49' to source (S) region 48 and may also be coupled to well contact (WC) region 47. Gate (G) electrode 54 is electrically coupled to gate (G) conductor 52 by (e.g., silicide) contact 54'.

When appropriate electrical potentials are applied to gate electrode 54 and drain or anode (D/A) portion 71-3 relative to well contact (WC) region 47 and source region 48, electrically conductive channel (CH) region 55 forms in well region 46, thereby allowing source-drain (S-D) current 56 to flow from source (S) or cathode (C) region 48 (collectively S/C region 48) through channel (CH) region 55 in well region 46, through drift space (DS) 441 in well region 44, underneath STI region 50 if present, and to one or the other of the external connections 61, 65 provided in connection with drain or anode (D/A) portion 71-3. Reference number 70-3 encompassing source or cathode (S/C) region 48 and channel (CH) region 55 identifies the origin and primary control region of source-drain (S-D) current 56 of hybrid transistor or device 58. For convenience, this is referred to as "MOS portion or location" 70-3 of hybrid transistor or device 58. Source electrode and contact 49, 49' is coupled to S/C region 48, and gate electrode and contact 54, 54' is coupled to gate (G) conductor 52, and are both associated with MOS portion 70-3. Reference number 71-3 identifies the terminus of source-drain (S-D) current 56 of hybrid transistor or device 58. As is more fully explained below, external connections or electrodes 61 and 65 (and associated contacts 61', 65') are associated with drain or anode (D/A) portion 71-3.

Drain or anode (D/A) portion 71-3 of hybrid transistor or device 58 of FIG. 3 desirably comprises (e.g., NPN) bipolar transistor 78. For convenience of description, electrode 61 along with associated contact 61' is identified as a base (B) electrode and contact of bipolar transistor 78 of D/A portion 71-3. Electrode 65 along with associated contact 65' is identified as an emitter (E) electrode and contact of bipolar transistor 78 of D/A portion 71-3. Desirably associated with bipolar transistor 78 are STI region(s) 50, but they may be replaced in other embodiments by surface dielectric region(s) or layer(s). For convenience of description of exemplary embodiments, STI region(s) 50 are henceforth assumed to be present. Where these and other regions appear multiple times in the cross-sectional views of FIGS. 3-11, the convention is adopted of referring to such region(s) with the conditional plural "(s)" indicating that such region(s) may be physically separate regions or may be a single annular shaped region that merely appears as multiple regions in the cross-sectional views of FIGS. 3-11. Either arrangement is useful.

In a preferred embodiment, (e.g., N type) sub-isolation-buried-layer (SIBL) region(s) 66 underlie STI region(s) 50 in (e.g., N type) well region 44 and desirably have an impurity concentration greater than an impurity concentration of (e.g., N type) well region 44. SIBL region(s) 66 are desirably used to reduce the series ON-resistance encountered by S-D current 56 flowing to bipolar transistor 78 within D/A portion 71-3. Bipolar transistor 78 desirably includes (e.g., N type) collector region 62, (e.g., P type) internal base region 59, (e.g., P+) external base contact region(s) 60, and (e.g., N+) emitter region 64. Collector region 62 is desirably of the same conductivity type as well region 44. In a preferred embodiment, collector region 62 desirably has a greater dopant concentration than the adjacent material of well region 44, but in other embodiments well region 44 can directly serve as collector region 62. Dielectric region(s) 63 separate (e.g., N+) emitter region 64 from (e.g., P+) external base region(s) 60. In a preferred embodiment, (e.g., NPN) bipolar transistor 78 is desirably a hetero junction bipolar transistor, that is, where (e.g., P type) internal base region 59 is formed of a different semiconductor than underlying (e.g., N type) collector region 62 and (e.g., N type) well region 44. SiGe, SiGeC and combinations thereof are non-limiting examples of materials useful for internal base region 59 where collector region 60 and/or well region 44 comprise silicon. Emitter region 64 may be usefully formed of (e.g., N+) epitaxial silicon or poly-silicon or combinations thereof, but other semiconductor materials may also be used in other embodiments. External (e.g., P+) base region(s) 60 are usefully formed of doped polysilicon or a combination of (e.g., P+) polysilicon and a metal-silicide, or an analogous metal-SC alloy for other semiconductor materials. Either arrangement is useful. Persons of skill in the art will understand that different selections of semiconductor materials may be made for these various regions depending upon the semiconductor material used for substrate 22 and/or well regions 44, 46.

S-D current 56 flows from source region 48 through channel region 55, across NP junction 43, through drift space 441, underneath STI region(s) 50 and associated SIBL regions 66 if present, to collector region 62 of bipolar transistor 78 of D/A region 71-3, from which it is extracted via base contact and electrode 61', 61 and/or emitter contact and electrode 65', 65 or both of bipolar transistor 78. Hybrid transistor or device 58 is capable of behaving primarily like an LIGBT device or primarily like an LDMOS device depending on which of contacts and electrodes 61', 61 or 65', 65 (or a combination thereof) is used for extracting S-D current 56. Hybrid transistor or device 58 exhibits LIGBT like behavior when emitter contact and electrode 65', 65 is, for example, left floating with respect to base contact and electrode 61', 61 or, at most, AC coupled, e.g., to an external bias terminal Hybrid transistor or device 58 exhibits LDMOS-like operation when emitter contact and electrode 65', 65 and base contact and electrode 61', 61 are DC coupled. Accordingly, the selection of which type of device behavior is provided can be made at the back-end metallization stage of manufacturing after the various doped regions (and in some embodiments, surface passivation layers) have been formed. For example: (i) LIGBT behavior is obtained by using base contact and electrode 61', 61 leading to (e.g., P type) base region 59, 60 to extract S-D current 56, or (ii) LDMOS like behavior is obtained by using emitter contact and electrode 65', 65 leading to (e.g., N+) emitter region 64, through internal base region 59 to collector region 62 in N-well region 44 to extract S-D current 56. In configuration (ii), some of S-D current 56 may also be extracted via base contact and electrode 61', 61. Depending upon which of configurations (i) or (ii) is being used, the other electrode of D/A portion 71-3, e.g., contact and electrode 65', 65 for LIGBT behavior or contact and electrode 61', 61 for LDMOS like behavior, may be left floating or DC biased to adjust the properties of bipolar transistor 78. Accordingly, the arrangement of hybrid transistor or device 58 provides great design flexibility. This is very desirable.

Hybrid transistor or device 58 provides both LDMOS-like and LIGBT-like operation in a single structure, depending on how it is connected. When only base 59, 60 of NPN 78 is biased, hybrid transistor or device 58 operates as a typical LIGBT with base 59, 60 of NPN 78 being the collector of the LIGBT. When only emitter 64 of NPN 78 is biased (e.g., at voltages higher than the turn-on voltage of the emitter-base junction of (e.g., NPN) transistor 78), bipolar current is suppressed and the ON current is defined by either electrons or holes, resulting in LDMOS-like behavior with emitter 64 of NPN 78 being the drain of the LDMOS. Because of its ability to provide either LDMOS-like or IGBT-like behavior depending upon the connections, hybrid transistor or device 58 may also be referred to as a multi-function transistor or device.

FIGS. 4-11 show simplified cross-sectional views of hybrid transistor or device 58 of FIG. 3 during various stages 404-411 of manufacture according to further embodiments of the invention. The brackets identifying MOS portion 70-3 and D/A portion 71-3 are included in FIGS. 4-11 to facilitate relating structures 604-611 of FIGS. 4-11 to hybrid transistor or device 58 of FIG. 3. Referring now to manufacturing stage 404 of FIG. 4, (e.g., P type) substrate 42 having upper surface 41 is provided. In a preferred embodiment, upper (e.g., P type) portion 42' of substrate 42 may be formed epitaxially, but in other embodiments need not be epitaxial. Cavity(s) 50' have been etched in surface 41 and mask 80 applied over surface 41 and cavities 50'. Mask 80 has open portion(s) 80-1 and closed portion(s) 80-2. Open portion(s) 80-1 are substantially aligned with at least some of cavity(s) 50', desirably those associated with D/A portion 71-3. Implant (IMP) A (e.g., N type) is provided through open portion(s) 80-1 overlying some of cavity(s) 50', desirably to form (e.g., N type) sub-isolation-buried-layer (SIBL) region(s) 66 of D/A portion 71-3, but SIBL regions 66 may be omitted in further embodiments. Structure 604 results.

Figure 4:
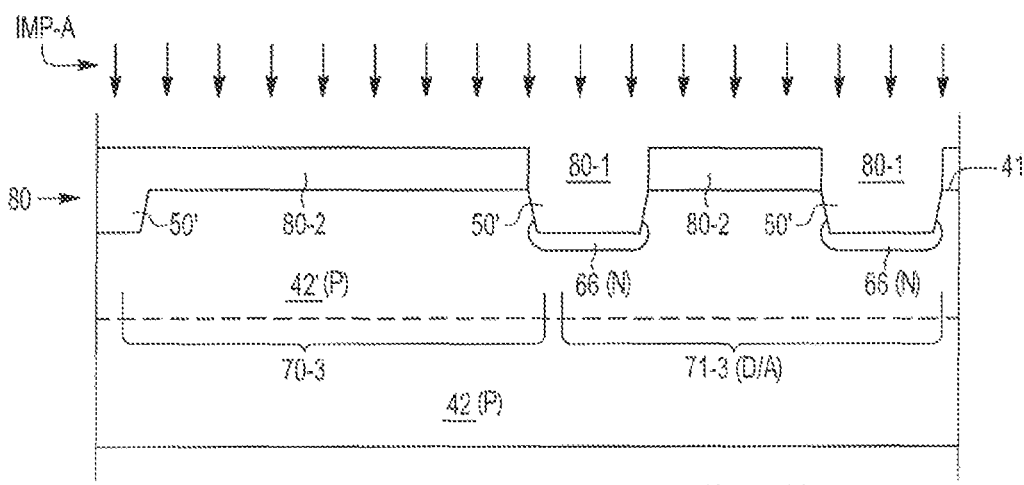
FIGS. 4-11 show simplified cross-sectional views of the hybrid transistor of FIG. 3 during various stages of manufacture according to further embodiments of the invention.
Figure 5:
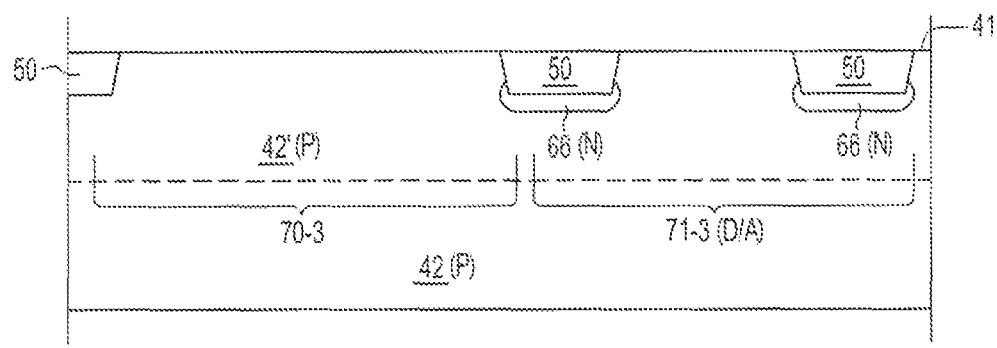
Figure 6:
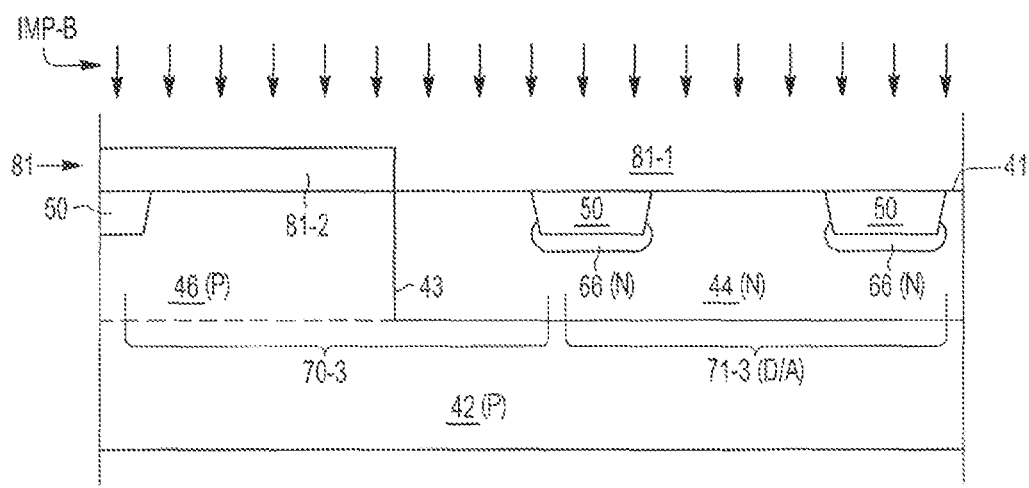

Referring now to manufacturing stage 405 of FIG. 5, mask 80 is removed from structure 604. A dielectric layer (not shown) of sufficient thickness to fill cavity(s) 50' of FIG. 4 is provided over surface 41 and then planarized, e.g., using chemical-mechanical-polishing (CMP). Structure 605 results, wherein cavity(s) 50' of structure 604 are filled by such dielectric thereby forming shallow-trench-isolation region(s) 50 shown in FIGS. 3 and 5. Referring now to manufacturing stage 406 of FIG. 6, mask 81 having open portion 81-1 and closed portion 81-2 is applied over surface 41. Implant (IMP) B is applied through open portion 81-1 to form (e.g. N type) well region 44 in substrate 42. Well region (e.g., P type) 46 shown in FIG. 6 may be provided by (e.g., P type) portion 42' of substrate 42 underlying closed mask portion 81-2. Well region 46 may also be formed by replacing mask 81 by inverse mask 81' (not shown) having an opening in the location of closed portion 81-2 of mask 81 and a closed portion in the location of open portion 81-1 of mask 81 and then providing (e.g., P type) implant B' (not shown) through the open portion of mask 81'. This procedure is useful where it is desired to have (e.g. P type) well region 46 have a different doping configuration than that of region 42' (see FIG. 5) of substrate 42, but either arrangement is useful. NP junction 43 is formed between (e.g., N type) well region 44 and (e.g., P type) well region 46. Structure 606 results.

Figure 7:
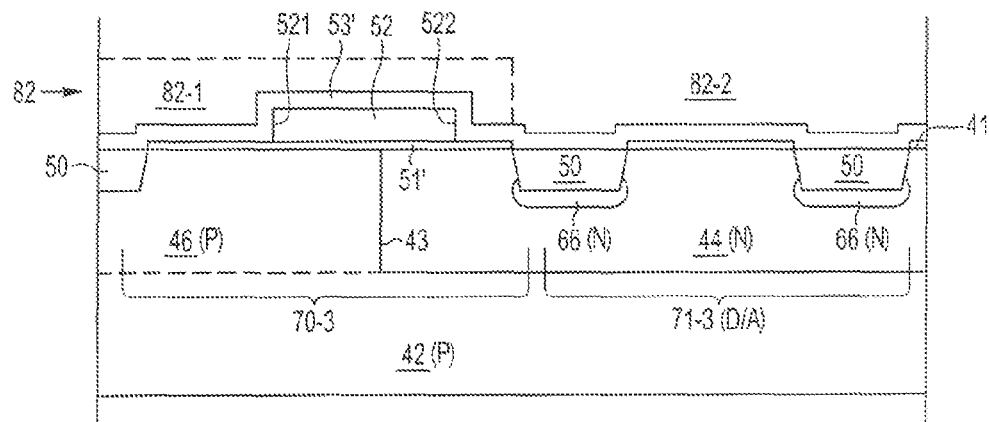

Referring now to manufacturing stage 407 of FIG. 7, gate dielectric layer 51' of MOS portion 70-3 is formed over surface 41 using means well known in the art. Gate dielectric layer 51' may be formed by, e.g., oxidation of surface 41 or by deposition of the desired dielectric. Layer 51' is the precursor to MOS gate insulator 51 of FIGS. 3 and 8-11. Layer 51' may be formed over substantially all of surface 41 or be localized to substantially the future location of gate conductor 52. Either arrangement is useful. Conductor layer 52' (not shown) is then deposited overlying dielectric layer 51' and patterned to provide gate conductor 52 in the desired location within MOS portion 70-3. Rightward edge 522 of gate conductor 52 should extend laterally at least to NP junction 43. Leftward edge 521 of gate conductor 52, in combination with remaining portions of overlying dielectric layer 53' determine in part the subsequent location of source region 48 of FIG. 3. Dielectric layer 53', e.g., of silicon nitride, is desirably provided over surface 41 and gate conductor 52. Dielectric layer 53' is subsequently conveniently used to provide lateral dielectric region(s) 53 of FIG. 3 at left lateral edge 521 and right lateral edge 522 of gate conductor 52, but may be omitted in other embodiments. Structure 607 results. The function of optional mask 82 shown by dashed lines in FIG. 7 is explained in connection with FIG. 8.

Figure 8:
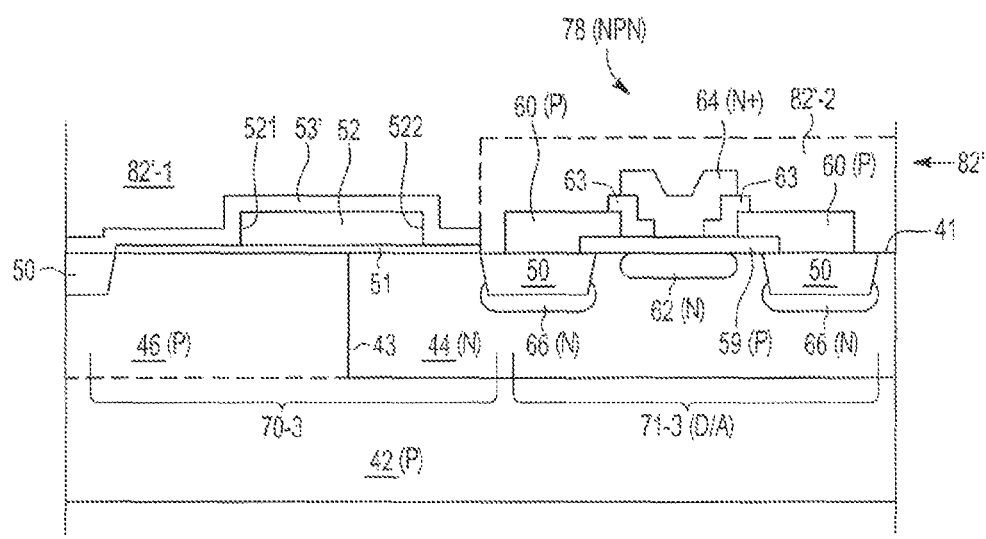
Figure 9:
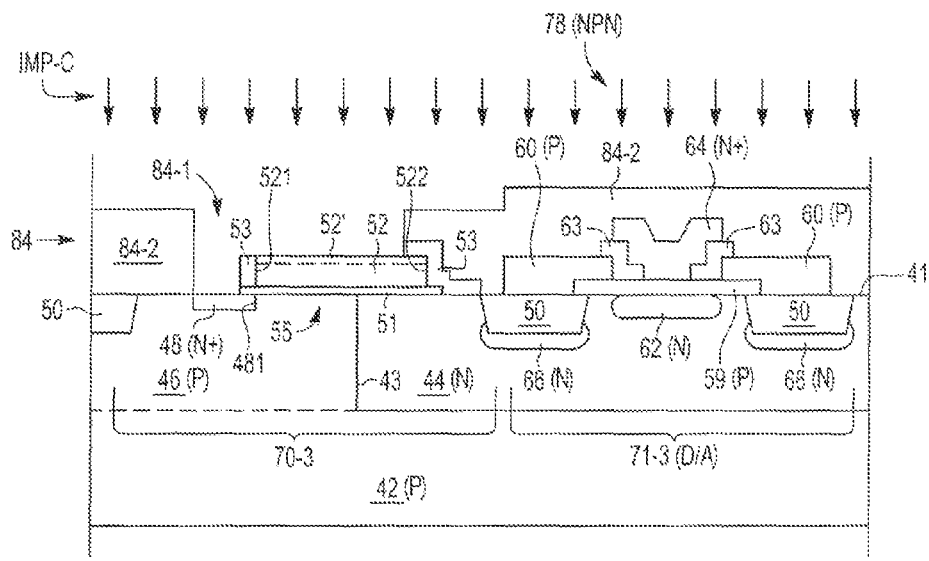

In manufacturing stage 408 of FIG. 8, (e.g., NPN) bipolar transistor 78 is formed in D/A portion 71-3. Collector region 62, internal base region 59, external base region 602, dielectric layer 63 and emitter region 64 are formed using methods well known in the art, so that transistor 78 illustrated in FIGS. 3 and 8-10 results. While bipolar transistor 78 is being formed, MOS portion 70-3 is protected. This may be accomplished in several ways. Referring again to FIG. 7, according to one embodiment, e.g., hard mask 82 is provided. Mask 82 has closed portion 82-1 overlying MOS portion 70-3 and open portion overlying D/A portion 71-3 in which bipolar transistor 78 can be formed without disturbing MOS portion 70-3. After formation of bipolar transistor 78, mask 82 is then removed as shown in FIG. 8.

According to another embodiment, mask 82 is omitted and layer 53' or equivalent serves as protection for MOS portion 70-3 during formation of bipolar transistor 78 in D/A portion 71-3. Since MOS portion 70-3 (including dielectric layer 53') is exposed during this operation, various layers needed to form bipolar transistor 78 may also cover all or part of MOS portion 70-3. These may be removed incrementally as the various portions of bipolar transistor 78 are patterned or, as shown in FIG. 8, e.g., soft mask 82' is applied substantially after bipolar transistor 78 is finished. Mask 82' is substantially the inverse of mask 82, that is, having open portion 82'-1 corresponding substantially to closed portion 82-1 of mask 82 and closed portion 82'-2 corresponding substantially to open portion 82-2 of mask 82. When bipolar transistor 78 is substantially complete, open portion 82'-2 of mask 82' is used to remove all those layers needed for bipolar transistor 78 that have accumulated over MOS portion 70-3, once again exposing dielectric layer 53', while leaving D/A portion 71-3 substantially undisturbed. Either arrangement or variations thereof are useful. Mask 82' is then removed. Structure 607 results.

Referring again to manufacturing stages 407-408 of FIGS. 7-8, (e.g., NPN) bipolar transistor 78, less metal contacts 61', 65' and electrodes 61, 65, is formed in D/A portion 71-3 using means well known in the art. That portion of dielectric layer 53' overlying D/A portion 71-3 may be removed prior to forming bipolar transistor 78 or in part before and in part during formation of bipolar transistor 78. Either arrangement is useful. In forming bipolar transistor 78, for example and not intended to be limiting, (e.g., N type) doped collector region 62 is provided in D/A portion 71-3, preferably about centrally located between STI regions 50 of D/A portion 71-3. Collector region 62 may be recessed or substantially extend to surface 41. Either arrangement is useful. Internal (e.g., P type) base region 59 is formed overlying collector region 62, preferably by epitaxial growth. As noted earlier, internal base region 59 is desirably of a different semiconductor material than substrate 42 and well region 44, as for example, and not intended to be limiting, of SiGe, SiGeC or combinations thereof, so as to form a hetero-junction bipolar transistor. External (e.g., P type) base region(s) 60 are formed and patterned so as to provide Ohmic electrical contact to internal base region 59. Regions 59 and 60 may be provided in either order, depending upon the available manufacturing capabilities.

A dielectric layer is provided overlying base region(s) 59, 60 and patterned to provide lateral dielectric region(s) 63 for separating external base region(s) 60 from subsequent emitter region 64. A central portion of internal base region 59 is exposed between lateral dielectric region(s) 63. Emitter (e.g., N+) region 64 is formed in contact with a central portion of (e.g., P type) internal base region 59, and separated from (e.g., P type) external base region(s) 60 by lateral dielectric region(s) 63. Emitter region 64 may be usefully formed of (e.g., N+) epitaxial silicon or poly silicon or a combination thereof, but other semiconductor materials may also be used. As has been explained above, during the foregoing operations for forming (e.g., NPN) bipolar transistor 78 in D/A portion 71-3, MOS portion 70-3 is substantially undisturbed. Structure 608 results.

Referring now to manufacturing stage 409, dielectric layer 53' is selectively etched to form dielectric regions 53 at the lateral edges of gate conductor 52, using methods well known in the art. Mask 84 is provided protecting bipolar transistor 78 of D/A portion 71-3 while MOS portion 70-3 is being finished. Mask 84 (e.g., photoresist) has open portion(s) 84-1 and closed portion(s) 84-2. Open portion 84-1 encompasses at least the desired location of source region 48. Implant (IMP) C is then provided through mask opening 84-1 to form source region 48. Opening 84-1 may also include gate conductor 52, depending on whether gate conductor 52 will benefit from implant (IMP) C used to form source region 48. Either arrangement is useful. Structure 609 results.

Figure 10:
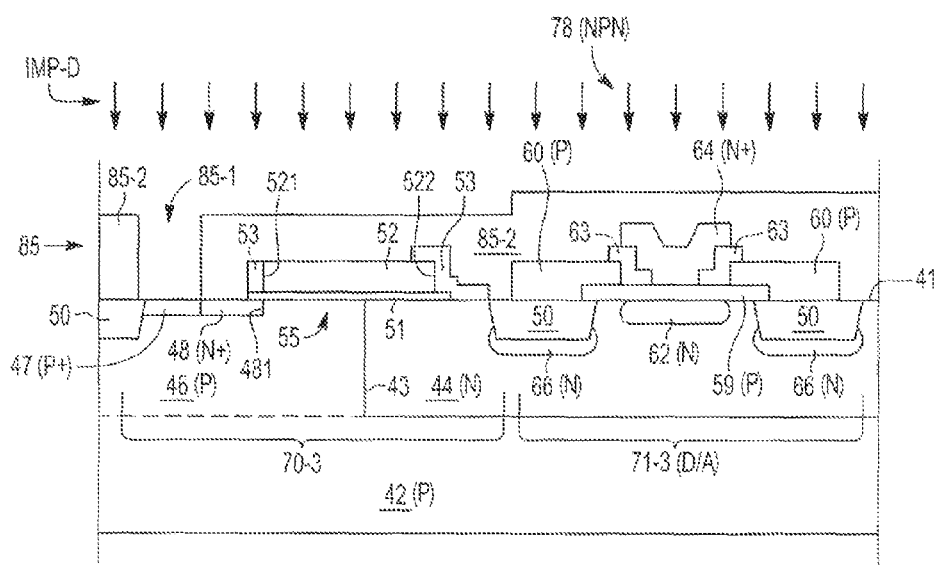

Referring now to manufacturing stage 410 of FIG. 10, mask 85 is provided having open portion 85-1 and closed portions 85-2. Open portion 85-1 is intended to define the lateral extend of (e.g., P+) well contact region 47, provided by (e.g., P type) implant (IMP) D. Other than contact metallization and any desired interconnections, hybrid transistor or device 58 is substantially finished. To avoid cluttering the drawings, conventional surface passivation layers applied before, during or after formation of electrical contacts to MOS portion 70-3 and D/A portion 71-3 are not shown. Structure 610 results. Manufacturing stages 409, 410 may be performed in either order.

Figure 11:
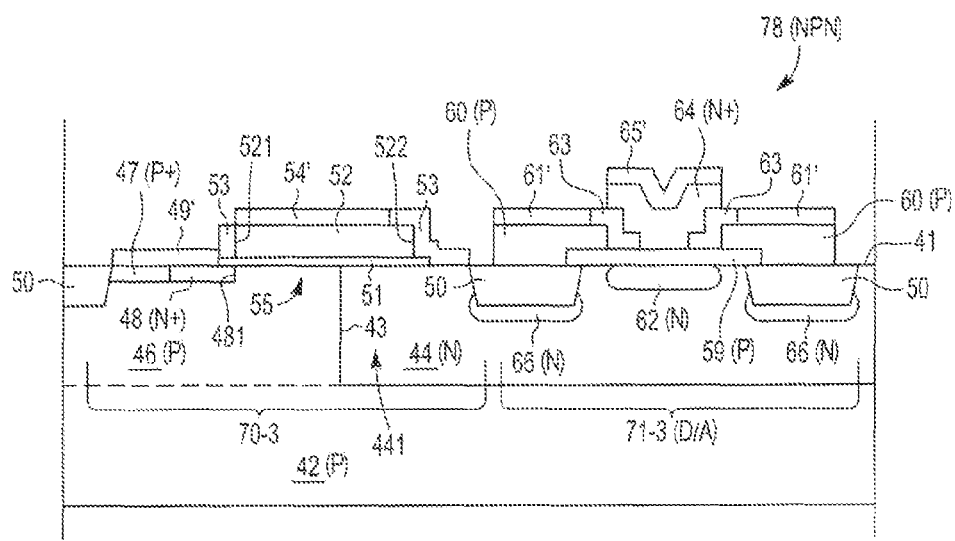

Referring now to manufacturing stage 411 of FIG. 11, e.g., silicide or other metal-SC alloy contacts 41', 54', 61', and 65' are formed on the exposed semiconductor regions 47 and 48, 52, 60, and 64, respectively, and not substantially on any exposed dielectric areas using methods well known in the art. However, in other embodiments, such contacts may be formed individually or in other groups. Either arrangement is useful. Structure 611 results. Except for provision of electrodes 49, 54, 61, and 65 as shown in FIG. 3, hybrid transistor or device 58 is substantially finished. Connection or lack thereof to base electrode 61 and emitter electrode 65 may be made at this stage, thus determining the types of properties exhibited by hybrid transistor or device 58, e.g., either LDMOS-like or IGBT-like, even though hybrid transistor or device 58 has been processed through the same manufacturing stages 404-411 leading to structure 611. Thus, the structure and method illustrated in the embodiments of FIGS. 3-11 provide great flexibility and manufacturing economy. These are valuable attributes.

According to first embodiment, there is provided a hybrid transistor (58), comprising, a substrate (42) having therein a first well region (46) of a first conductivity type, a second well region (44) of a second, opposite, conductivity type, extending substantially to a first surface (41) of the substrate (42), the first (46) and second (44) well regions forming an NP or PN junction (43) therebetween, an MOS portion (70-3) having a source region (48) of the second conductivity type extending to the first surface (41) in the first well region (46), and having a gate conductor (52) overlying and insulated from the first surface (41) at least over the first well region (46) with a first lateral end (521) proximate the source region (48) and a second lateral end (522) extending at least to the NP or PN junction (43), and a drain or anode (D/A) portion (71-3) in the second (44) well region, the D/A portion (71-3) comprising a bipolar transistor (78) having an emitter region (64) of the second conductivity type, a base region (59) of the first conductivity type communicating with the emitter region (64), and a collector region (62) of the second conductivity type communicating with the base region (59), wherein the collector region (62) is located in the second well region (44) laterally separated from the NP or PN junction (43). According to a further embodiment, the hybrid transistor (58) further comprises a principal terminal (61) thereof coupled to the base region (59) but not connected to the emitter region (64). According to a still further embodiment, the hybrid transistor (58) further comprises a principal terminal (65) thereof coupled to the emitter region (64) but not connected to the base region (59). According to a yet further embodiment, the hybrid transistor (58) further comprises a principal terminal (61, 65) thereof coupled to both the emitter region (64) and the base region (59). According to a still yet further embodiment, the hybrid transistor (58) further comprises a dielectric filled shallow trench isolation (STI) region (50) laterally located in the second well region (44) between the NP or PN junction (43) and the collector region (62) of the bipolar transistor (78). According to a yet still further embodiment, the hybrid transistor (58) further comprises a sub-isolation-buried-layer (SIBL) region (66) beneath the STI region (50) in the second well region (44), and having a dopant concentration larger than the second well region (44). According to another embodiment, the bipolar transistor (78) is a hetero junction bipolar transistor. According to a still another embodiment, the base region (59) of the bipolar transistor (78) is formed of a different semiconductor material than the collector region (62). According to a yet another embodiment, the bipolar transistor (78) is substantially a vertical transistor with the emitter region (64), the base region (59) and the collector region (62) arranged substantially one above the other.

According to a second embodiment, there is provided a method for forming a transistor (58) comprising, providing a substrate (42) having therein a first well region (46) of a first conductivity type and a second well region (44) of a second, opposite, conductivity type, extending substantially to a first surface (41) of the substrate (42), the first (46) and second (44) well regions forming an NP or PN junction (43) therebetween, and wherein the first (46) and the second (44) well regions have therein an MOS-portion (70-3) and the second well region (44) has therein a drain or anode (D/A) portion (71-3), forming in the MOS-portion (70-3), a gate conductor (52) overlying and insulated from the first surface (41) at least over the first well region (46) and having a first lateral end (521) adapted to substantially locate a first edge (481) of a subsequently formed source region (48) within the first well region (46) and a second lateral end (522) extending at least to the NP and PN junction (43), protecting the MOS-portion (70-3) while a bipolar transistor (78) is subsequently formed in the D/A portion (71-3) in the second well region (44), forming the bipolar transistor (78) in the second well region (44), wherein the bipolar transistor comprises an emitter region (64) of the second conductivity type, an internal base region (59) of the first conductivity type communicating with the emitter region (64), and a collector region (62) of the second conductivity type communicating with the internal base region (59), protecting the D/A portion (71-3) and, in either order, forming the source region (48) of the second conductivity type in the first (46) well region and having the first edge (481) laterally proximate the first lateral end (521) of the gate conductor (52), and forming a well contact region

(47) of the first conductivity type in the first (46) well region, and forming multiple conductive contacts (49', 54', 61', 65') communicating respectively with the source region (48), the gate conductor (52), the internal base region (59) of the bipolar transistor (78) and the emitter region (64) of the bipolar transistor (78). According to a further embodiment, the method further comprises forming a conductive first well region contact (47) in the first well region (46), sharing a conductive contact (49') with the source region (48). According to a still further embodiment, the step of providing the substrate (42), further comprises forming one or more shallow-trench-isolation (STI) regions (50) extending into the substrate (42) from the first surface (41). According to a yet further embodiment, the step of forming one or more shallow-trench-isolation (STI) regions (50), further comprises, forming sub-isolation-buried-layer (SIBL) regions (66) of the second conductivity type underlying at least some of the one or more STI regions (50). According to a still yet further embodiment, the step of forming the bipolar transistor (78) comprises, forming a hetero junction bipolar transistor (78). According to a yet still further embodiment, the step of forming the hetero-junction bipolar transistor (78), comprises, forming the hetero junction bipolar transistor (78) having a base region (59) of a different semiconductor material than the second well region (44).

According to a third embodiment, there is provided a multifunction transistor (58), comprising, an MOS portion (70-3) and a drain or anode (D/A) portion (71-3), respectively, in first (46) and second (44) well regions of different conductivity types, and with a lateral NP or PN junction (43) therebetween, wherein the MOS portion (70-3) comprises in the first well region (46) a source region (48) and a first well contact region (47), which source region (48) and first well contact (47) region substantially share a common electrode (49'), and wherein the D/A portion (71-3) comprises in the second well region (44) a substantially vertical hetero-junction bipolar transistor (78) having a base connection (61') and an emitter connection (65') that may be used separately or together as a principal electrode of the multifunction transistor (58). According to a further embodiment, the principal electrode of the multifunction transistor (58) is coupled to the emitter connection (65'). According to a still further embodiment, the principal electrode of the multifunction transistor (58) is coupled to the base connection (61'). According to a yet further embodiment, the principal electrode of the multifunction transistor (58) is coupled to both the base connection (61') and the emitter connection (65'). According to a still yet further embodiment, the transistor (58) further comprises in the MOS portion (70-3) a gate conductor (52) insulated at least from the first well region (46) and extending laterally substantially from the source region (48) to at least the NP or PN junction (43).

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a transistor comprising:
   providing a substrate having therein a first well region of a first conductivity type and a second well region of a second, opposite conductivity type, extending substantially to a first surface of the substrate, the first and second well regions forming an NP or PN junction therebetween, and wherein the first and the second well regions have therein an MOS-portion and the second well region has therein a drain or anode (D/A) portion;
   forming in the MOS-portion, a gate conductor overlying and insulated from the first surface at least over the first well region and having a first lateral end adapted to substantially locate a first edge of a subsequently formed source region within the first well region and a second lateral end extending at least to the NP and PN junction;
   protecting the MOS-portion while a bipolar transistor is subsequently formed in the D/A portion in the second well region;
   forming the bipolar transistor in the second well region, wherein the bipolar transistor comprises an emitter region of the second conductivity type, an intrinsic base region of the first conductivity type communicating with the emitter region, and a collector region of the second conductivity type communicating with the intrinsic base region;
   protecting the D/A portion and, in either order, forming the source region of the second conductivity type in the first well region and having the first edge laterally proximate the first lateral end of the gate conductor, and forming a well contact region of the first conductivity type in the first well region; and
   forming multiple conductive contacts communicating respectively with the source region, the gate conductor, the intrinsic base region of the bipolar transistor and the emitter region of the bipolar transistor.

2. The method of claim 1, further comprising forming a conductive first well region contact in the first well region and sharing a conductive contact with the source region.

3. The method of claim 1, wherein the step of providing the substrate further comprises forming one or more shallow-trench-isolation (STI) regions extending into the substrate from the first surface.

4. The method of claim 3, wherein the step of forming one or more shallow-trench-isolation (STI) regions further comprises, forming sub-isolation-buried-layer (SIBL) regions of the second conductivity type underlying at least some of the one or more STI regions.

5. The method of claim 1, wherein the step of forming the bipolar transistor comprises, forming a hetero junction bipolar transistor.

6. The method of claim 5, wherein the step of forming the hetero junction bipolar transistor comprises forming the hetero-junction bipolar transistor having a base region of a different semiconductor material than the second well region.

7. A method for forming a transistor, comprising:
   providing a substrate having a first well region of a first conductivity type, a second well region of a second, opposite conductivity type and extending substantially to a first surface of the substrate, and an NP or PN junction formed between the first and second well regions;
   forming a MOS portion having a source region of the second conductivity type extending to the first surface in the first well region, and having a gate conductor overlying and insulated from the first surface at least over the first well region with a first lateral end proximate the source region and a second lateral end extending at least to the NP or PN junction; and forming a drain or anode (D/A) portion in the second well region, the D/A portion comprising a bipolar transistor having an emitter region of the second conductivity type, a base region of the first conductivity type communicating with the emitter region, and a collector region of the second conductivity type communicating with the base region, the collector region located in the second well region laterally separated from the NP or PN junction.

8. The method of claim 7, further comprising forming a principal terminal electrically coupled to the base region and electrically isolated from the emitter region.

9. The method of claim 7, further comprising forming a principal terminal electrically coupled to the emitter region and electrically isolated from the base region.

10. The method of claim 7, further comprising forming a principal terminal electrically coupled to both the emitter region and the base region.

11. The method of claim 7, further comprising forming a dielectric filled shallow trench isolation (STI) region laterally located in the second well region between the NP or PN junction and the collector region of the bipolar transistor.

12. The method of claim 11, further comprising forming a sub-isolation-buried-layer (SIBL) region in the second well region, the SIBL region located beneath the STI region and having a dopant concentration greater than the second well region.

13. The method of claim 7, wherein the bipolar transistor is a hetero-junction bipolar transistor.

14. The method of claim 13, further comprising forming the base region of the bipolar transistor and the collector region from different semiconductor materials.

15. The method of claim 7, wherein the bipolar transistor is substantially a vertical transistor with the emitter region, the base region and the collector region arranged substantially one above the other.

16. A method of forming a transistor, comprising:
providing a first well region of a first conductivity type;
providing a second well region of a second conductivity type, the second well region forming a lateral NP or PN junction with the first well region;
forming a MOS portion in at least one of the first and second well regions, the MOS portion comprising:
a source region in the first well region; and
a first well contact region in the first well region;
forming a drain or anode (D/A) portion in at least one of the first and second well regions; and
producing a substantially vertical hetero-junction bipolar transistor in the DA portion, the substantially vertical hetero-junction bipolar transistor having a base connection and an emitter connection that may be used separately or together as a principal electrode of the multi-function transistor.

17. The method of claim 16, further comprising forming a principal electrode electrically coupled to the emitter connection.

18. The method of claim 16, further comprising forming a principal electrode electrically coupled to the base connection.

19. The method of claim 16, further comprising forming a common electrode electrically coupled to the source region and to the first well contact region.

20. The method of claim 16, further comprising forming a gate conductor in the MOS portion, the gate conductor insulated at least from the first well region and extending laterally substantially from the source region to at least the NP or PN junction.

* * * * *